United States Patent
Niwa et al.

(10) Patent No.: US 8,077,066 B2
(45) Date of Patent: Dec. 13, 2011

(54) ΔΣ MODULATOR

(75) Inventors: Atsumi Niwa, Kanagawa (JP);
Tomohiro Matsumoto, Kanagawa (JP);
Takashi Moue, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/662,463

(22) Filed: Apr. 19, 2010

(65) Prior Publication Data
US 2010/0283648 A1      Nov. 11, 2010

(30) Foreign Application Priority Data

May 8, 2009 (JP) .................................. 2009-113746

(51) Int. Cl.
*H03M 3/00* (2006.01)
(52) U.S. Cl. ...................................... 341/143; 341/155
(58) Field of Classification Search .................. 341/143, 341/155, 156, 172
See application file for complete search history.

(56) References Cited

U.S. PATENT DOCUMENTS

| | | | |
|---|---|---|---|
| 4,914,956 A * | 4/1990 | Young et al. | 73/861.356 |
| 6,388,601 B1 | 5/2002 | De Gouy et al. | |
| 6,414,615 B1 | 7/2002 | Cheng | |
| 7,324,036 B2 * | 1/2008 | Petre et al. | 341/155 |
| 7,405,687 B2 * | 7/2008 | Mitteregger et al. | 341/143 |
| 2005/0068213 A1 * | 3/2005 | Fontaine et al. | 341/143 |

FOREIGN PATENT DOCUMENTS

| | | |
|---|---|---|
| JP | 2002-528989 | 3/2002 |
| JP | 2003-534679 | 11/2003 |

OTHER PUBLICATIONS

L. J. Breems, et al., A 1.8-m W CMOS ΣΔ Modulator with Integrated Mixer for A/D Conversion of IF Signals, IEEE, Journal of Solid-State Circuits, vol. 35, No. 4, Apr. 2000.
P. Fontaine, et al., "A Low-Noise Low-Voltage CT ΔΣ Modulator with Digital Compensation of Excess Loop Delay," IEEE, International Solid-State Circuits Conference, pp. 498-499, 2005.

* cited by examiner

*Primary Examiner* — Joseph Lauture
(74) *Attorney, Agent, or Firm* — Rader, Fishman & Grauer PLLC

(57) ABSTRACT

Disclosed herein is a ΔΣ modulator including: at least one integrator; a quantizer for quantizing a signal output by the integrator and outputting the quantized signal as a digital signal; and a compensation section configured to compensate the ΔΣ modulator for a non-ideal characteristic caused by an internal loop delay, wherein the compensation section is a feedback path formed to start at the output node of the quantizer and end at the input node of the integrator immediately preceding the quantizer, and the feedback path formed to start at the output node of the quantizer and end at the input node of the integrator realizes a frequency-independent part in combination with the integrator and an internal DA converter which adopts the NRZ technique to suppress the signal amplitude at the quantizer input.

1 Claim, 12 Drawing Sheets

ΔΣ MODULATOR

BACKGROUND OF THE INVENTION

1. Field of the Invention

In general, the present invention relates to a continuous-time-system ΔΣ modulator applied to audio-electronic and medical-treatment/measurement apparatus and the like in addition to radio-communication receivers which serve as main applications. More particularly, the present invention relates to a loop delay compensation circuit of the ΔΣ modulator.

2. Description or the Related Art

FIG. 1 is a block diagram showing an ordinary second-order low-pass ΔΣ modulator 1 of the continuous time system.

The ΔΣ modulator 1 shown in the block diagram of FIG. 1 is configured to employ integrators INT1 and INT2, a quantizer Quan, adders ADD1 and ADD2 as well as DA (Digital-to-Analog) converters DAC1 and DAC2.

In the block diagram of FIG. 1, reference notation u denotes an analog input signal whereas reference notation v denotes a digital output signal. Reference notations $a_1$ and $a_2$ denote the feedback gains of the DA converters DAC1 and DAC2 respectively whereas reference notations $c_1$ and $c_2$ denote the gains of the integrators INT1 and INT2 respectively. Reference notation Q denotes the effective gain of the quantizer Quan.

For the ΔΣ modulator 1 shown in the block diagram of FIG. 1, the NTF (noise transfer function) of quantization noises to the digital output signal v is expressed by an equation given below. The quantization noises are quantization error generated in the quantizer Quan. The NTF expressed by the equation shows a high-pass frequency characteristic.

$$NTF = \frac{s^2}{s^2 + a_1 c_1 Q s + a_2 c_1 c_2 Q} \quad (1)$$

That is to say, the quantization noises generated by the quantizer Quan in the ΔΣ modulator 1 are subjected to a noise shaping process due to a feedback effect in order to shift the noises to a high-frequency region. Thus, in the signal band of the low-frequency region, a high SNR (signal to noise ratio) is obtained.

If processing delays are introduced by the quantizer Quan and/or the DA converters DAC1 and DAC2 in the ΔΣ modulator 1 shown in the block diagram of FIG. 1, however, the NTF expressed by the above equation no longer holds true in a strict manner. In this case, the effect of the noise shaping process may become smaller so that the SNR deteriorates. In addition, in some cases, the feedback loop of the ΔΣ modulator 1 may oscillate.

In order to solve the problems raised by the DE modulator 1 as described above, loop-delay compensation technologies have been developed. Typical loop-delay compensation technologies are described in JP-T-2002-528989 and JP-T-2003-534679 (hereinafter referred to as Patent Documents 1 and 2, respectively) as well as "A Low-Noise Low-Voltage CT ΔΣ Modulator with Digital Compensation of Excess Loop Delay," IEEE, International Solid-State Circuits Conference, 2005, pp. 498 to 499 and "A 1.8-mW CMOS ΔΣ Modulator with Integrated Mixer for A/D Conversion of IF Signals," IEEE, Journal of Solid-State Circuits, Vol. 35, No. 4, April 2000 (hereinafter referred to as Non-Patent Documents 1 and 2, respectively).

FIG. 2 is a block diagram showing a ΔΣ modulator 2 which has a delay compensation function disclosed in Patent Document 1.

The ΔΣ modulator 2 shown in the block diagram of FIG. 2 employs an S/H (Sample/Hold) circuit SH1 and a compensation filter FLT1 which are provided at the input stage in front of the quantizer Quan. The compensation filter FLT1 feeds an output signal of the S/H circuit SH1 back to the S/H circuit SH1 so as to compensate the input-to-output voltage transfer function for effects of the problems raised by the ΔΣ modulator 1.

FIG. 3 is a block diagram showing the (compensation) filter circuit FLT1 employed in the ΔΣ modulator 2 shown in the block diagram of FIG. 2.

By properly setting the input-to-output voltage transfer function of the compensation filter FLT1, it is possible to compensate the input-to-output voltage transfer function of the ΔΣ modulator 2 for effects of the problems raised by the ΔΣ modulator 1.

FIG. 4 is a block diagram showing a ΔΣ modulator 3 which has a delay compensation function disclosed in Patent Document 2.

The configuration of the ΔΣ modulator 3 shown in the block diagram of FIG. 4 employs another DA converter DAC3 which feeds an output signal of the quantizer Quan back to the input node of the quantizer Quan so as to compensate the input-to-output voltage transfer function of the ΔΣ modulator 3 for the problems raised by the ΔΣ modulator 1. This delay compensation technique is the contemporary technique most widely adopted to compensate the input-to-output voltage transfer function of a ΔΣ modulator for effects of the delay problems described above.

FIG. 5 is a block diagram showing a ΔΣ modulator 4 which has a delay compensation function described in non-Patent Document 1.

The ΔΣ modulator 4 shown in the block diagram of FIG. 5 is configured to serve as a modulator which is capable of carrying out the delay compensation process as digital signal processing. In comparison with the ΔΣ modulator 3 shown in the block diagram of FIG. 4, the ΔΣ modulator 4 employs a register and an adder in place of the other DA converter DAC3 provided for the delay compensation purpose.

FIG. 6 is a block diagram showing a ΔΣ modulator 5A which has a delay compensation function disclosed in non-Patent Document 2.

The ΔΣ modulator 5A shown in the block diagram of FIG. 6 is configured to function as a modulator which is capable of adjusting coefficients in order to compensate the input-to-output voltage transfer function of the ΔΣ modulator 5A for function changes caused by delays. In order to compensate the input-to-output voltage transfer function of the ΔΣ modulator 5A, the ΔΣ modulator 5A employs a path which is added to the integrator INT1 as a path including only constant-term elements.

FIG. 7 is a circuit diagram showing the integrator INT1 provided with a path which includes only constant-term elements.

In the configuration of the integrator INT1 provided with a path including only constant-term elements, in order to implement the constant term, a resistor $R_{int}$ is connected in series to the capacitor $C_{int}$. Since the resistor $R_{int}$ is the only element required for the delay compensation, both the power consumption and the circuit size are smallest among the circuits of the proposed ΔΣ modulators described above.

SUMMARY OF THE INVENTION

In the case of the ΔΣ modulator 2 shown in the block diagram of FIG. 2, however, the filter circuit FLT1 employs a plurality of resistors R and a plurality of S/H circuits so that the ΔΣ modulator 2 has a large power consumption and a large circuit size. In addition, since the S/H circuit SH1 employs a plurality of resistors R as shown in the block diagram of FIG. 3, the sensitivity to variations of characteristics of devices produced in a process of manufacturing the integrated circuit of the ΔΣ modulator 2 becomes higher, raising another problem.

In the case of the configuration of the ΔΣ modulator 3 shown in the block diagram of FIG. 4, the ΔΣ modulator 3 employs another DA converter DAC3 which feeds an output signal of the quantizer Quan back to the input node of the quantizer Quan by way of an adder ADD3 so as to compensate the input-to-output voltage transfer function of the ΔΣ modulator 3 for processing delays. In addition, the ΔΣ modulator 3 also employs the adder ADD3 to serve as an adder for subtracting a signal output by the DA converter DAC3 from a signal output by the first integrator INT1. Thus, the ΔΣ modulator 3 raises a problem of an increased power consumption and area.

In the case of the configuration of the ΔΣ modulator 4 shown in the block diagram of FIG. 5, in order to obtain required computation precision according to actual design specifications for carrying out the delay compensation process as digital processing, it is necessary to handle multi-bit data. As a result, the quantizer Quan employed in the ΔΣ modulator 4 must adopt a multi-bit configuration which is naturally unnecessary, raising a problem of more complicated computation.

In addition, the circuit size of the quantizer Quan increases exponentially with the number of bits. Thus, the ΔΣ modulator 4 also raises a problem of a large circuit size.

In the case of the configuration of the ΔΣ modulator 5A shown in the block diagram of FIG. 6, in the integrator INT1, a resistor $R_{int}$ is connected in series to the capacitor $C_{int}$. Thus, the ΔΣ modulator 5A raises a problem that the input-to-output voltage transfer function of the ΔΣ modulator 5A changes due to an effect of a parasitic capacitor $C_{p2}$ that connects the connection point between the resistor $R_{int}$ and the capacitor $C_{int}$ to the ground.

In general, on both the sides of a capacitor of a floating type, ground-connected parasitic capacitors exist. In the case of the integrator INT1 shown in the block diagram of FIG. 7, the ground-connected parasitic capacitors $C_{p1}$ and $C_{p2}$ exist on both the sides of the capacitor $C_{int}$. Since the ground-connected parasitic capacitor $C_{p1}$ is connected to a specific one of the two input nodes of the integrator INT1 that is a low-impedance connection point, therefore, there is no effect of the ground-connected parasitic capacitor $C_{p1}$ on the whole characteristic.

A problem common to all the circuits of the ΔΣ modulators described above is that, if any particular one of the ΔΣ modulators is configured to operate as a modulator in a continuous time system, the amplitude of a voltage signal appearing at the input node of the quantizer Quan increases due to the operation to supply a feedback quantity to a connection point close to the quantizer input node. That is to say, the problem common to all the circuits of the ΔΣ modulators described above is a problem that the range of the voltage signal input to the quantizer Quan must be undesirably limited in order to avoid a clipping phenomenon caused by the increase of the voltage signal appearing at the input node of the quantizer Quan.

This is because the effect of low-pass filtering to eliminate high-frequency signals originated from the inner side of the loop of the ΔΣ modulator is weakened.

For example, in the case of the ΔΣ modulator 5A shown in the block diagram of FIG. 6, a high-frequency signal passing through the DA converter DAC2 is attenuated by the second-order low-pass filter composed of INT1 and INT2. However, a signal passing through the DA converter DAC1 appears as combination of two terms at quantizer input node. The one is (only) first-order attenuated by frequency-dependent term of INT1 ($c_1/s$). The another is not affected by any filtering effect because of frequency-independent term of INT1 ($Kc_1$).

Thus, if a DA converter is connected to the inner side of the loop, a high-frequency component of output signal by the DA converter is not filtered and appears at the input node of the quantizer Quan as it is. As a result, the ΔΣ modulator 5A raises a problem of an increased amplitude of a signal which appears at the input node of the quantizer Quan.

In addition, the increase of the amplitude of the signal appearing at the input node of the quantizer Quan is also dependent on the waveform of the signal output by the DA converter. If the waveform of the signal output by the DA converter has a rectangular shape like one shown in a diagram of FIG. 8, the frequency spectrum of the signal can be expressed by Eq. (2) given as follows.

$$X(j\omega) = \frac{2A}{\omega}\sin\left(\frac{\omega t}{2}\right) \cdot e^{-j\frac{\omega t}{2}} \quad (2)$$

As the signal output by the DA converter, it is possible to generate a signal $X_1$ or $X_2$. The signal $X_1$ is an NRZ (nonreturn to zero) signal whereas the signal $X_2$ is a signal of the RZ (return to zero) with a duty ratio of 50%. In this case, the frequency spectrum of the NRZ signal $X_1$ and the frequency spectrum of the RZ signal $X_2$ are expressed by Eqs. (3) and (4) respectively as follows:

$$X_1(j\omega) = \frac{2A_1}{\omega}\sin\left(\frac{\omega T_s}{2}\right) \cdot e^{-j\frac{\omega T_s}{2}} \quad (3)$$

$$X_2(j\omega) = \frac{2A_2}{\omega}\sin\left(\frac{\omega T_s}{4}\right) \cdot e^{-j\frac{\omega T_s}{4}} \quad (4)$$

In Eqs. (3) and (4) given above, reference notation $T_S$ denotes a sampling period whereas each of reference notations $A_1$ and $A_2$ denotes the DC (direct current) strength of the signal.

Usually, a ΔΣ modulator is designed so that feedback signals output by DA converters have the same magnitude expressed by the area A×t shown in the diagram of FIG. 8. With the ΔΣ modulator so designed, the amplitude of a signal output by the DA converter to serve as the NRZ signal $X_1$ is half the amplitude of a signal output by the DA converter to serve as the RZ signal $X_2$. It is obvious from comparison of Eq. (3) with Eq. (4) that the signal with the frequency spectrum thereof expressed by Eq. (4) has a stronger power in the high-frequency region than the signal with the frequency spectrum thereof expressed by Eq. (3).

That is to say, the range of the voltage input to the quantizer Quan must be undesirably limited in order to avoid a clipping phenomenon as explained before if the RZ system is adopted instead of the NRZ system as a system for generating the waveform of the signal output by the DA converter because, with the RZ system adopted, the signal appearing at the input node of the quantizer Quan as a signal generated by adoption of the RZ system has a larger amplitude than the signal generated in accordance with the NRZ system.

FIG. 9 is a diagram showing typical waveforms of signals output by the DA converter provided for delay compensation and typical waveforms of signals supplied to the quantizer Quan.

In the diagram of FIG. 9, reference notation $A_{RZ}$ denotes the amplitude of a signal appearing at the input node of the quantizer Quan as a signal generated by adoption of the RZ system whereas reference notation $A_{NRZ}$ denotes the amplitude of a signal appearing at the input node of the quantizer Quan as a signal generated by adoption of the NRZ system. From the diagram of FIG. 9, it is obvious that the relation $A_{RZ} > A_{NRZ}$ holds true, indicating that, by making use of a DA converter adopting the RZ system, the signal appearing at the input node of the quantizer Quan as a signal generated by adoption of the RZ system has a larger amplitude than the signal generated in accordance with the NRZ system.

Inventors of the present invention have innovated a ΔΣ modulator capable of carrying out a delay compensation process while preventing the amplitude of a signal appearing at the input node of a quantizer employed in the ΔΣ modulator from increasing, capable of operating without making use of an internal DA converter and capable of achieving a low power consumption of the entire circuit of the ΔΣ modulator.

A ΔΣ modulator according to a first embodiment of the present invention employs:

at least one integrator;

a quantizer for quantizing a signal output by the integrator and outputting the quantized signal as a digital signal; and a compensation section for compensating the ΔΣ modulator for a non-ideal characteristic caused by an internal loop delay.

The compensation section is a feedback path formed to start at the output node of the quantizer and end at the input node of the integrator immediately preceding the quantizer. The feedback path formed to start at the output node of the quantizer and end at the input node of the integrator does not exhibit a frequency-dependent characteristic.

It is desirable that the compensation section includes a DA (Digital-to-Analog) converter for converting a digital signal generated by the quantizer into an analog signal and a capacitor connected to the output node of the DA converter.

In accordance with the present invention, it is possible to carry out a delay compensation process while preventing the amplitude of a signal appearing at the input node of the quantizer employed in the ΔΣ modulator from increasing, possible to operate the ΔΣ modulator without making use of an internal DA converter and possible to achieve a low power consumption of the entire circuit of the ΔΣ modulator.

DETAILED DESCRIPTION OF THE PREFERRED EMBODIMENTS

Preferred embodiments of the present invention are explained by referring to the diagrams in chapters which are arranged as follows.

1: First Embodiment
2: Second Embodiment
3: Third Embodiment

1. First Embodiment

First Rough Configuration of the ΔΣ Modulator

Figure 10:
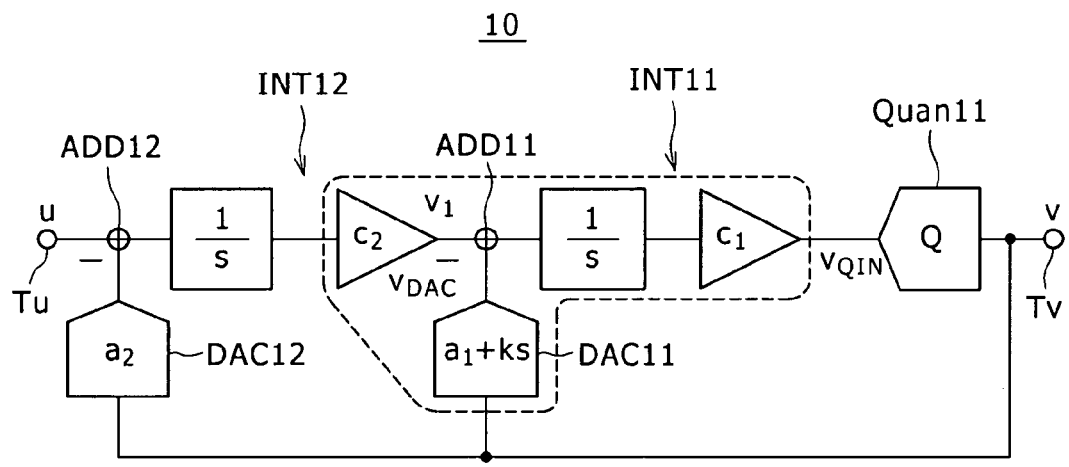
FIG. 10 is a block diagram showing a rough configuration of a ΔΣ modulator which has a loop delay compensation path according to a first embodiment of the present invention.

FIG. 10 is a block diagram showing a rough configuration of a ΔΣ modulator 10 which has a loop delay compensation path according to a first embodiment of the present invention.

As shown in the block diagram of FIG. 10, the ΔΣ modulator 10 employs a first integrator INT11, a second integrator INT12, a quantizer Quan11, a first adder ADD11 serving as a portion of a compensation section and a second adder ADD12.

The ΔΣ modulator 10 also includes a first DA converter DAC11 and a second DA converter DAC12.

In the block diagram of FIG. 10, reference notation u denotes an analog input signal supplied to the ΔΣ modulator 10 whereas reference notation Tu denotes an input terminal for receiving the analog input signal u. Reference notation v denotes a digital output signal v generated by the quantizer Quan11 whereas reference notation TV denotes an output terminal for outputting the digital output signal v. Expression $(a_1 + ks)$ represents the feedback gain of the first DA converter DAC11 whereas reference notation $a_2$ denotes the feedback gain of the second DA converter DAC12.

Reference notation $c_1$ denotes the gain of the first integrator INT11 whereas reference notation $c_2$ denotes the gain of the second integrator INT12. Reference notation Q denotes the effective gain of the quantizer Quan11.

In the ΔΣ modulator 10, the first input node of the second adder ADD12 is connected to the analog-signal input terminal Tu for receiving the analog input signal u whereas the second input node of the second adder ADD12 is connected to the output node of the second DA converter DAC12.

The output node of the second adder ADD12 is connected to the input node of the second integrator INT12. The output node of the second integrator INT12 is connected to the first input node of the first adder ADD11.

The second input node of the first adder ADD11 is connected to the output node of the first DA converter DAC11 whereas the output node of the first adder ADD11 is connected to the input node of the first integrator INT11.

The output node of the first integrator INT11 is connected to the input node of the quantizer Quan11.

The output node of the quantizer Quan11 is connected to the digital-signal output terminal TV for outputting the digital output signal v. The digital output signal v is fed back to the first DA converter DAC11 and the second DA converter DAC12.

Figure 11:
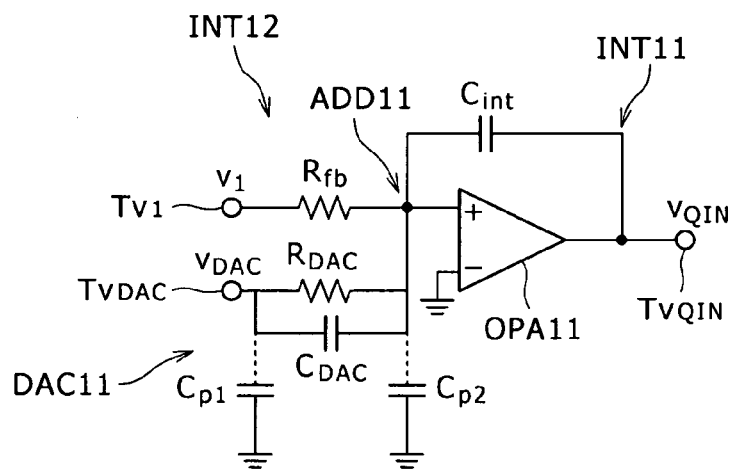
FIG. 11 is a concrete circuit diagram showing the circuit of a portion enclosed by a dashed line in the block diagram of FIG. 10.

FIG. 11 is a concrete circuit diagram showing the circuit of a portion enclosed by a dashed line in the block diagram of FIG. 10.

In the circuit diagram of FIG. 11, the concrete circuit configurations of the first adder ADD11 and the first integrator INT11 are shown.

A resistor $R_{fb}$ and an output node $T_{v1}$ are included in the output section of the second integrator INT12.

A resistor $R_{DAC}$, a capacitor $C_{DAC}$ and an output node $T_{VDAC}$ are included in the output section of the first DA converter DAC11.

The first integrator INT11 itself has an operational amplifier OPA11, a capacitor $C_{int}$ and an output node $T_{VQIN}$.

A specific one of the two ends of the resistor $R_{fb}$ is connected to the output node $T_{v1}$ of the second integrator INT12 whereas the other end of the resistor $R_{fb}$ is connected to the non-inverting input node (+) of the operational amplifier OPA11 employed in the first integrator INT11.

In the output section of the first DA converter DAC11, a specific one of the two ends of the resistor $R_{DAC}$ is connected to the output node $T_{VDAC}$ whereas the other end of the resistor $R_{DAC}$ is connected to the other end of the resistor $R_{fb}$.

A specific one of the two electrodes of the capacitor $C_{DAC}$ is connected to the output node $T_{VDAC}$ whereas the other electrode of the capacitor $C_{DAC}$ is connected to the other end of the resistor $R_{fb}$ and the other end of the resistor $R_{DAC}$.

A virtual-ground node connecting the other end of the resistor $R_{fb}$, the other end of the resistor $R_{DAC}$ and the other electrode of the capacitor $C_{DAC}$ to each other forms the aforementioned first adder ADD11 in current-mode.

The non-inverting input node (+) of the operational amplifier OPA11 employed in the first integrator INT11 is connected to the output node of the first adder ADD11.

On the other hand, the inverting input node (−) of the operational amplifier OPA11 is connected to the ground GND which serves as a reference electric potential.

The capacitor $C_{int}$ is connected between the output node of the operational amplifier OPA11 and the non-inverting input node (+) of the operational amplifier OPA11.

In the ΔΣ modulator 10 according to the first embodiment, basically, the feedback gain of the first DA converter DAC11 is set at ($a_1$+ks) in order to implement a feedback path which has a frequency-independent part for the delay compensation process.

The output node $T_{VDAC}$ is a node at which a voltage $V_{DAC}$ obtained as a result of a DA conversion process carried out by the first DA converter DAC11 appears.

Figure 1:
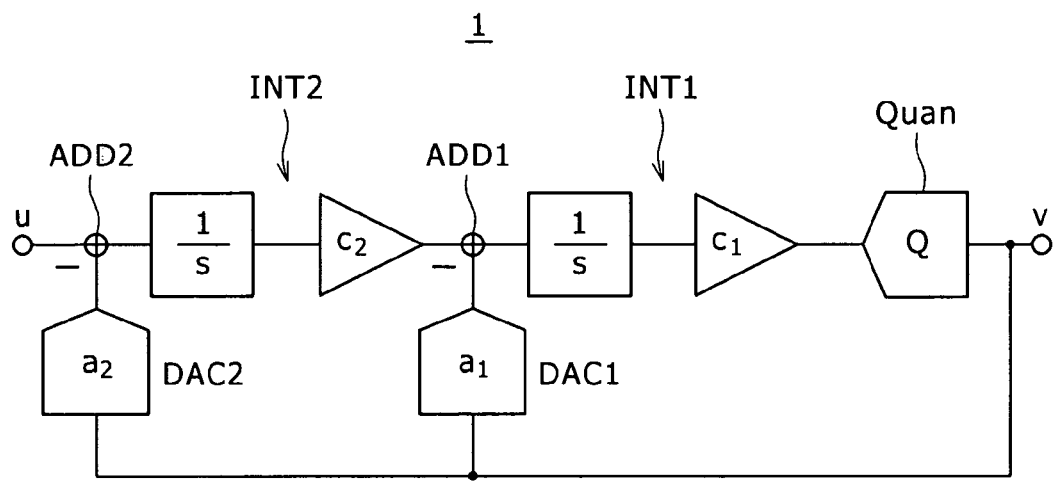
FIG. 1 is a block diagram showing an ordinary second-order low-pass ΔΣ modulator of the continuous time system.
Figure 2:
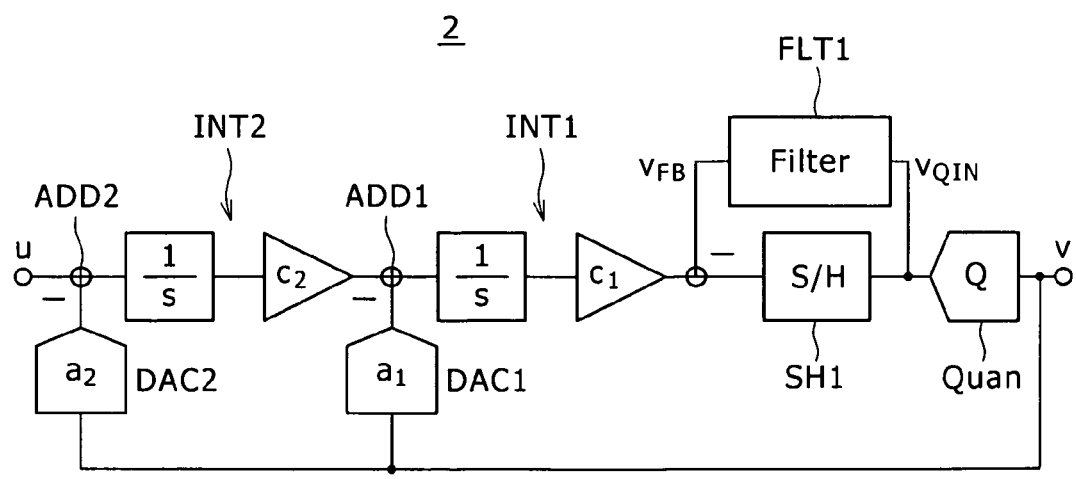
FIG. 2 is a block diagram showing a ΔΣ modulator which has a delay compensation function described in Patent Document 1.
Figure 3:
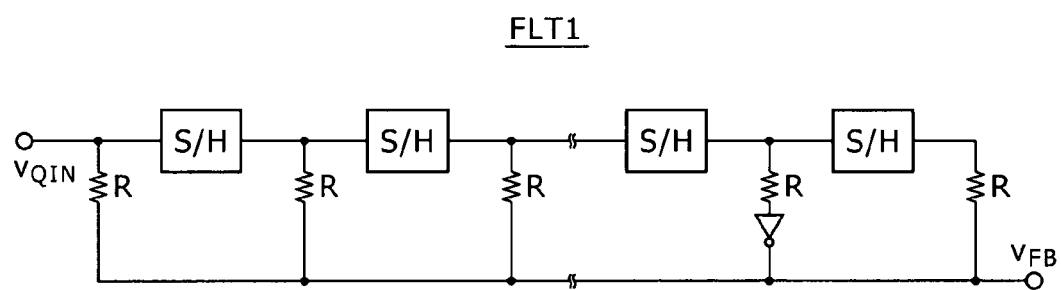
FIG. 3 is a block diagram showing a filter circuit employed in the ΔΣ modulator shown in the block diagram of FIG. 2.
Figure 4:
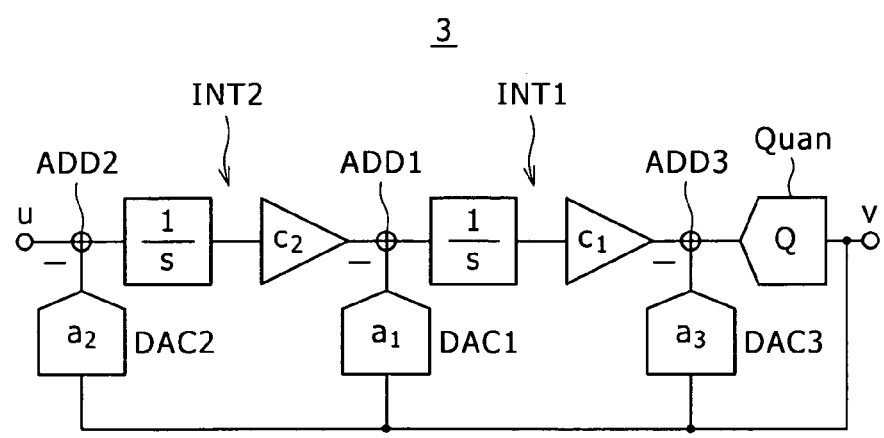
FIG. 4 is a block diagram showing a ΔΣ modulator which has a delay compensation function described in Patent Document 2.
Figure 5:
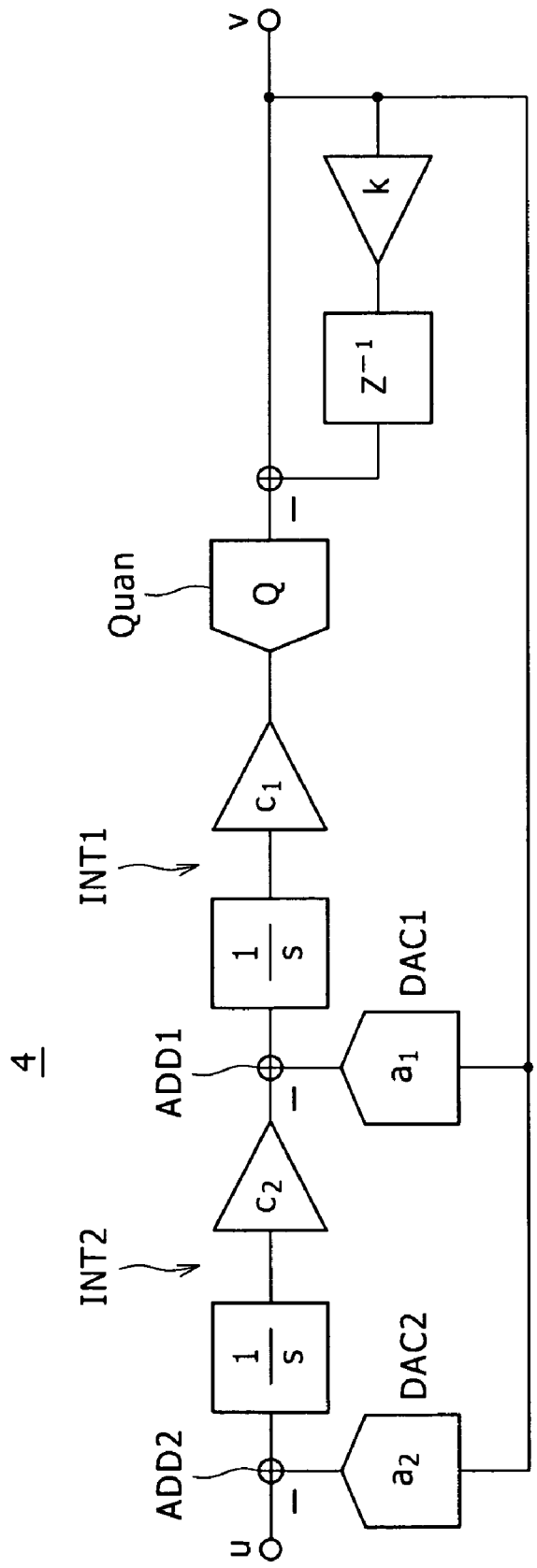
FIG. 5 is a block diagram showing a ΔΣ modulator which has a delay compensation function described in non-Patent Document 1.
Figure 6:
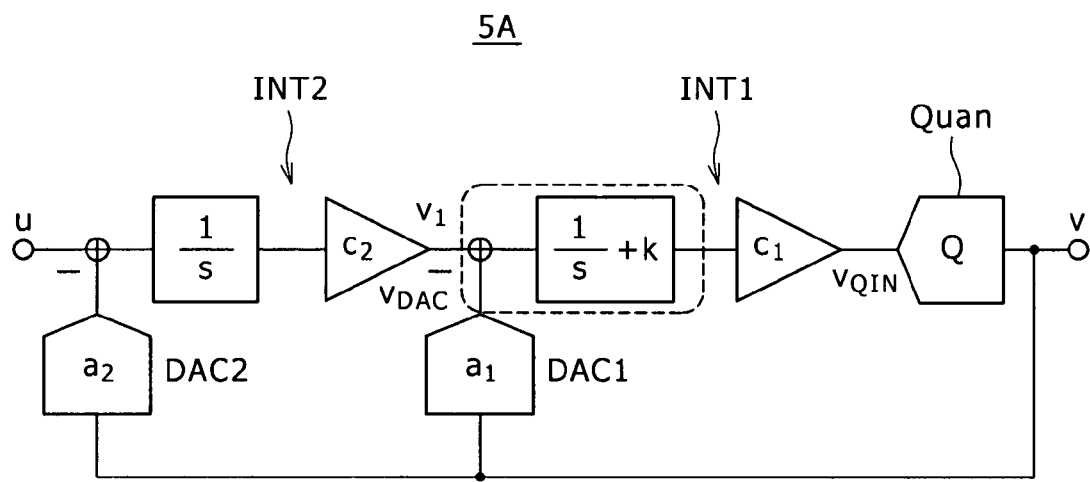
FIG. 6 is a block diagram showing a ΔΣ modulator which has a delay compensation function described in non-Patent Document 2.
Figure 7:
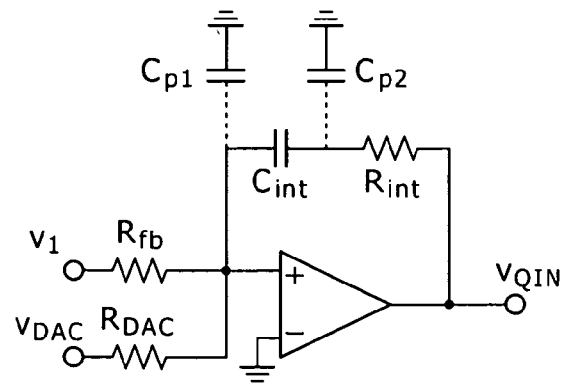
FIG. 7 is a circuit diagram showing an integrator provided with a path which includes only constant-term elements.
Figure 8:
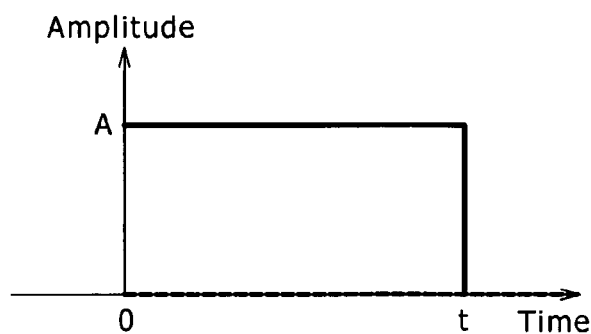
FIG. 8 is a diagram showing a typical waveform of a signal output by a DA (Digital-to-Analog) converter.
Figure 9:
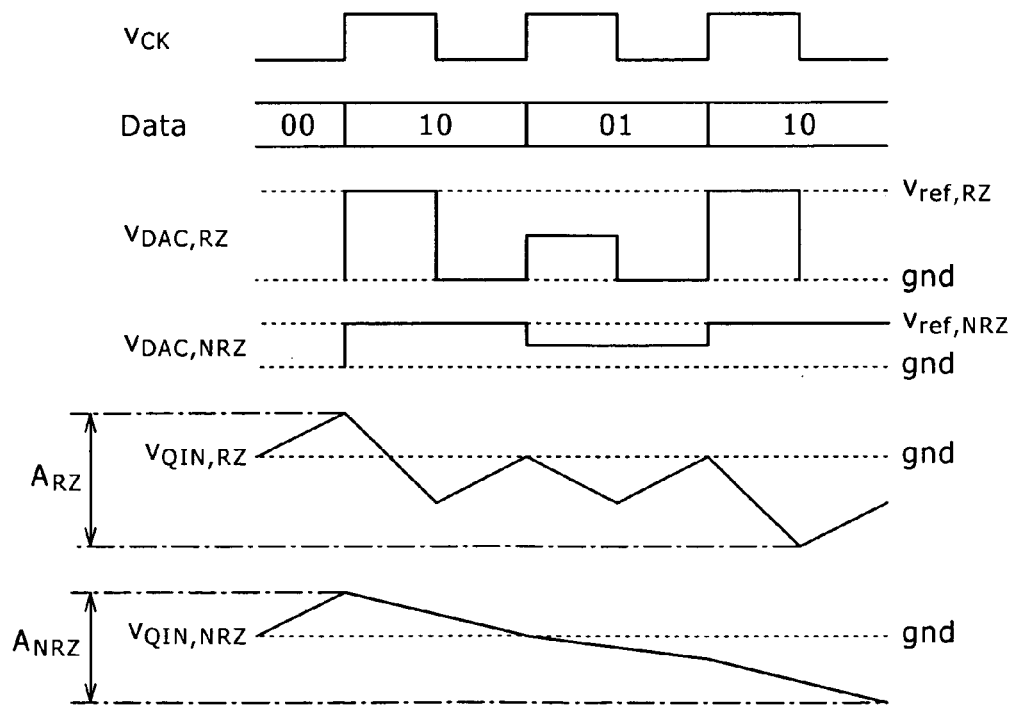
FIG. 9 is a diagram showing typical waveforms of signals output by a DA converter provided for delay compensation and typical waveforms of signals supplied to a quantizer.

Thus, by merely employing passive components in the same way as the ΔΣ modulator 5A shown in the block diagram of FIG. 6, it is possible to prevent the power consumption and the circuit size from increasing without the need to add a new circuit.

On top of that, all devices employed in the second integrator INT12, the first DA converter DAC11 and the first integrator INT11 which are shown in the circuit diagram of FIG. 11 are connected to the output node of a voltage source and/or the input/output nodes of the operational amplifier OPA11. In addition, the output node of the voltage source and the input/output nodes of the operational amplifier OPA11 are each a connection point with a low impedance. Thus, the circuit shown in the circuit diagram of FIG. 11 can be configured to serve as a circuit which is hardly affected by parasitic capacitors $C_{p1}$ and $C_{p2}$ connected to the ground.

In the circuit shown in the circuit diagram of FIG. 11, the first DA converter DAC11 is configured to adopt the NRZ system, which has a small signal power in a high frequency region, so that the amplitude of a signal appearing at the input node of the quantizer Quan11 can be suppressed as described earlier.

First Concrete Configuration of the ΔΣ Modulator

Figure 12:
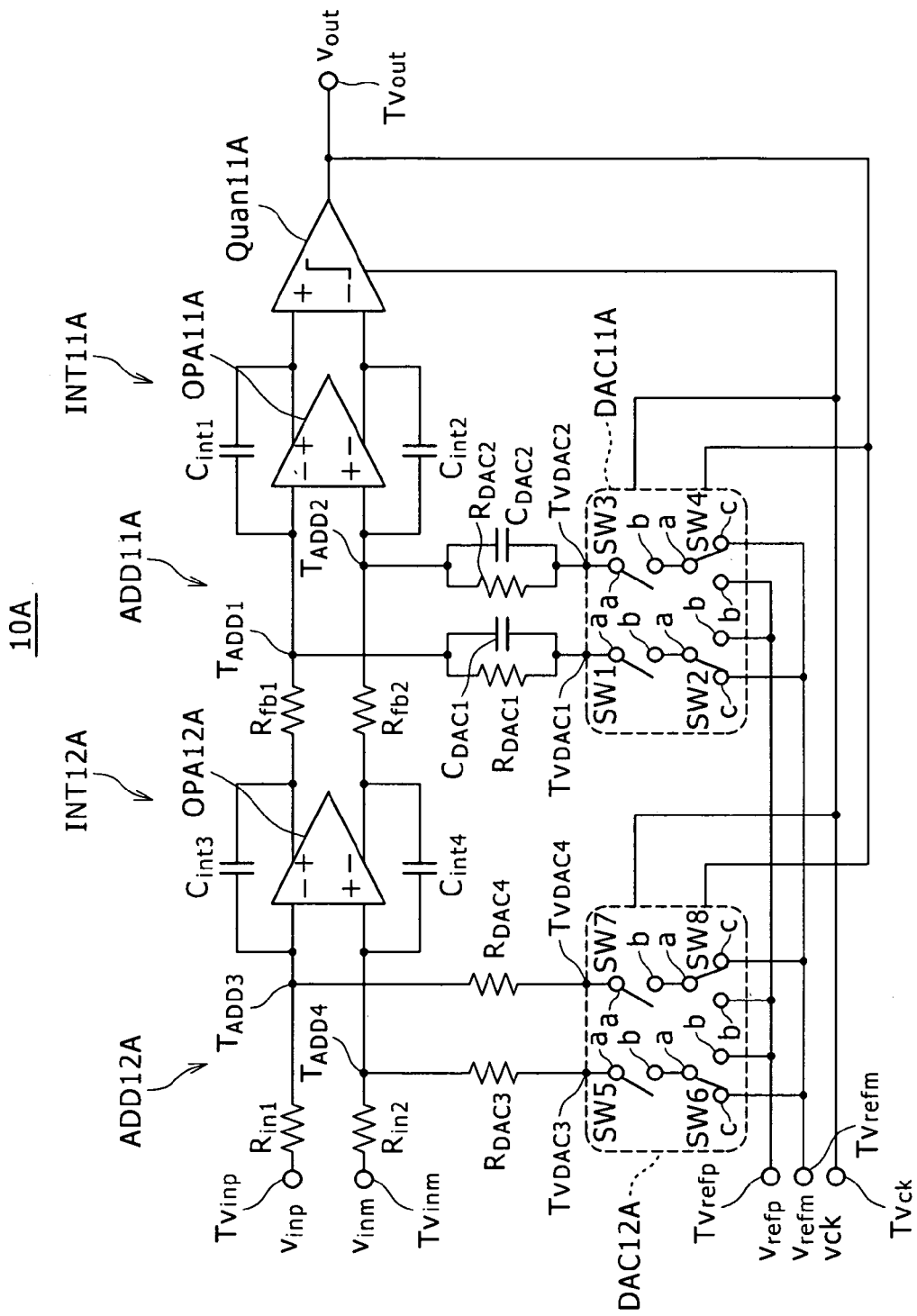
FIG. 12 is a circuit diagram showing a typical concrete configuration of a ΔΣ modulator which has a loop delay compensation path according to the first embodiment of the present invention.

FIG. 12 is a circuit diagram showing a typical concrete configuration of a ΔΣ modulator 10A which has a loop delay compensation path according to the first embodiment of the present invention.

The ΔΣ modulator 10A shown in the circuit diagram of FIG. 12 is designed to operate as a second-order 1-bit feedback ΔΣ modulator of the continuous time system.

To be more specific, the ΔΣ modulator 10A shown in the circuit diagram of FIG. 12 is designed to work as a circuit receiving a pair of analog input signals which are referred to as a differential input signal.

In the circuit diagram of FIG. 12, reference notation $V_{inp}$ denotes the positive-phase analog input signal, reference notation $V_{inm}$ denotes the negative-phase analog input signal whereas reference notation $V_{out}$ denotes a digital output signal.

In addition, reference notation $V_{refp}$ denotes a positive reference voltage provided for DA converters DAC11A and DAC12A, reference notation $V_{refm}$ denotes a negative reference voltage also provided for both DA converters whereas reference notation Vck denotes a clock signal.

As shown in the circuit diagram of FIG. 12, the ΔΣ modulator 10A has a first analog-signal input terminal $T_{Vinp}$, a second analog-signal input terminal $T_{Vinm}$, a first reference-voltage input terminal $T_{Vrefp}$, a second reference-voltage input terminal $T_{Vrefm}$ and a clock input terminal $T_{Vck}$ for receiving the clock signal Vck cited before.

In addition, the ΔΣ modulator 10A also has an input resistor $R_{in1}$ connected to the first analog-signal input terminal $T_{Vinp}$, an input resistor $R_{in2}$ connected to the second analog-signal input terminal $T_{Vinm}$ and an output terminal $T_{Vout}$ for outputting a digital output signal $V_{out}$ generated by the ΔΣ modulator 10A.

The ΔΣ modulator 10A also has a resistor $R_{DAC1}$ and a capacitor $C_{DAC1}$ which together form a parallel circuit connected to a first output node $T_{VDAC1}$ of the first DA converter DAC11A. By the same token, the ΔΣ modulator 10A also includes a resistor $R_{DAC2}$ and a capacitor $C_{DAC2}$ which together form a parallel circuit connected to a second output node $T_{VDAC2}$ of the first DA converter DAC11A.

In addition, the ΔΣ modulator 10A also has a resistor $R_{DAC3}$ connected to a first output node $T_{VDAC3}$ of the second DA converter DAC12A. By the same token, the ΔΣ modulator 10A also includes a resistor $R_{DAC4}$ connected to a second output node $T_{VDAC4}$ of the second DA converter DAC12A.

In the output section of a second integrator INT12A, the ΔΣ modulator 10A employs a first adder ADD11A, a resistor $R_{fb1}$ connected to the parallel circuit consisting of the resistor $R_{DAC1}$ and the capacitor $C_{DAC1}$ which are connected to the first output node $T_{VDAC1}$ of the first DA converter DAC11A as well as a resistor $R_{fb2}$ connected to the parallel circuit consisting of the resistor $R_{DAC2}$ and the capacitor $C_{DAC2}$ which are connected to the second output node $T_{VDAC2}$ of the first DA converter DAC11A.

A node serving as a point connecting the resistor $R_{fb1}$ to the parallel circuit consisting of the resistor $R_{DAC1}$ and the capacitor $C_{DAC1}$ is used as a first connection node $T_{ADD1}$ which is assigned to a first adder ADD11A. On the other hand, a node serving as a point connecting the resistor $R_{fb2}$ to the parallel circuit consisting of the resistor $R_{DAC2}$ and the capacitor $C_{DAC2}$ is used as a second connection node $T_{ADD2}$ which is assigned to the first adder ADD11A.

By the same token, a node serving as a point connecting the resistor $R_{in1}$ to the resistor $R_{DAC4}$ is used as a third connection node $T_{ADD3}$ which is assigned to a second adder ADD12A. On the other hand, a node serving as a point connecting the resistor $R_{in2}$ to the resistor $R_{DAC3}$ is used as a fourth connection node $T_{ADD4}$ which is assigned to the second adder ADD12A.

A first integrator INT11A has an operational amplifier OPA11A, a capacitor $C_{INT1}$ and a capacitor $C_{INT2}$. The operational amplifier OPA11A has two input nodes for receiving a differential input signal and two output nodes for outputting a differential output signal.

The negative-side input node (−) of the operational amplifier OPA11A is connected to the first node $T_{ADD1}$ of the first adder ADD11A whereas the positive-side input node (+) of the operational amplifier OPA11A is connected to the second node $T_{ADD2}$ of the first adder ADD11A. The negative-side input node (−) is also referred to as an inverting input node (−) whereas the positive-side input node (+) is also referred to as the non-inverting input node (+).

The positive-side output node (+) of the operational amplifier OPA11A is connected to the positive-side input node (+) of a quantizer Quan11A whereas the negative-side output node (−) of the operational amplifier OPA11A is connected to the negative-side input node (−) of the quantizer Quan11A.

The capacitor $C_{INT1}$ is connected between the positive-side output node (+) of the operational amplifier OPA11A and the negative-side input node (−) of the operational amplifier OPA11A.

On the other hand, the capacitor $C_{INT2}$ is connected between the negative-side output node (−) of the operational amplifier OPA11A and the positive-side input node (+) of the operational amplifier OPA11A.

By the same token, a second integrator INT12A has an operational amplifier OPA12A, a capacitor $C_{int3}$ and a capacitor $C_{int4}$. The operational amplifier OPA12A has two input nodes for receiving a differential input signal and two output nodes for outputting a differential output signal.

The negative-side input node (−) of the operational amplifier OPA12A is connected to the third node $T_{ADD3}$ of the second adder ADD12A whereas the positive-side input node (+) of the operational amplifier OPA12A is connected to the fourth node $T_{ADD4}$ of the second adder ADD12A.

The positive-side output node (+) of the operational amplifier OPA12A is connected to the resistor $R_{fb1}$ whereas the negative-side output node (−) of the operational amplifier OPA12A is connected to the resistor $R_{fb2}$.

The capacitor $C_{int3}$ is connected between the positive-side output node (+) of the operational amplifier OPA12A and the negative-side input node (−) of the operational amplifier OPA12A.

On the other hand, the capacitor $C_{int4}$ is connected between the negative-side output node (−) of the operational amplifier OPA12A and the positive-side input node (+) of the operational amplifier OPA12A.

As shown in the circuit diagram of FIG. 12, the first DA converter DAC11A has switches SW1, SW2, SW3 and SW4.

A node a of the switch SW1 is connected to the first output node $T_{VDAC1}$ whereas a node b of the switch SW1 is connected to a node a of the switch SW2.

A node b of the switch SW2 is connected to the first reference-voltage input terminal $T_{Vrefp}$ whereas a node c of the switch SW2 is connected to the second reference-voltage input terminal $T_{Vrefm}$.

A node a of the switch SW3 is connected to the second output node $T_{VDAC2}$ whereas a node b of the switch SW3 is connected to a node a of the switch SW4.

A node b of the switch SW4 is connected to the first reference-voltage input terminal $T_{Vrefp}$ whereas a node c of the switch SW4 is connected to the second reference-voltage input terminal $T_{Vrefm}$.

By the same token, as shown in the circuit diagram of FIG. 12, the second DA converter DAC12A has switches SW5, SW6, SW7 and SW8.

A node a of the switch SW5 is connected to the first output node $T_{VDAC3}$ whereas a node b of the switch SW5 is connected to a node a of the switch. SW6.

A node b of the switch SW6 is connected to the first reference-voltage input terminal $T_{Vrefp}$ whereas a node c of the switch SW6 is connected to the second reference-voltage input terminal $T_{Vrefm}$.

A node a of the switch SW7 is connected to the second output node $T_{VDAC4}$ whereas a node b of the switch SW7 is connected to a node a of the switch SW8.

A node b of the switch SW8 is connected to the first reference-voltage input terminal $T_{Vrefp}$ whereas a node c of the switch SW8 is connected to the second reference-voltage input terminal $T_{Vrefm}$.

As described above, the ΔΣ modulator 10A having a configuration shown in the circuit diagram of FIG. 12 is designed to operate as a second-order 1-bit feedback ΔΣ modulator of the continuous time system. The first DA converter DAC11A plays a role of a feedback DA converter, which is provided at the second stage, as well as a role of a loop-delay compensation section.

Each of the first DA converter DAC11A and the second DA converter DAC12A generates an output voltage synchronously with the clock signal Vck.

The output voltage generated by the first DA converter DAC11A is determined by the level of the digital output signal $V_{out}$ generated by the ΔΣ modulator 10A. By the same token, the output voltage generated by the second DA converter DAC12A is also determined by the level of the digital output signal $V_{out}$ generated by the ΔΣ modulator 10A.

To put it in detail, with the digital output signal $V_{out}$ set at a high level, the switches SW4 and SW8 select the negative-side reference voltage $V_{refm}$ and the switches SW2 and SW6 select the positive-side reference voltage $V_{refp}$, operating to lower the level of the digital output signal $V_{out}$ generated by the ΔΣ modulator 10A.

With the digital output signal $V_{out}$ set at a low level, on the other hand, the switches SW4 and SW8 select the positive-side reference voltage $V_{refp}$, and the switches SW2 and SW6 select the negative-side reference voltage $V_{refm}$ operating to raise the level of the digital output signal $V_{out}$ generated by the ΔΣ modulator 10A.

In accordance with the first embodiment, the ΔΣ modulator 10A functioning as an AD (Analog-to-Digital) converter in a continuous time system makes use of NRZ-system DA converters in order to compensate the input-to-output voltage transfer characteristic of the ΔΣ modulator 10A for a characteristic change caused by a loop delay due to a propagation delay generated in every circuit block of the ΔΣ modulator 10A. To put it in detail, by merely adding a signal path including no integration terms, it is possible to compensate the input-to-output voltage transfer characteristic while preventing the amplitude of a signal appearing at the input section of a quantizer employed in the ΔΣ modulator 10A from increasing.

2. Second Embodiment

Second Rough Configuration of the ΔΣ Modulator

Figure 13:
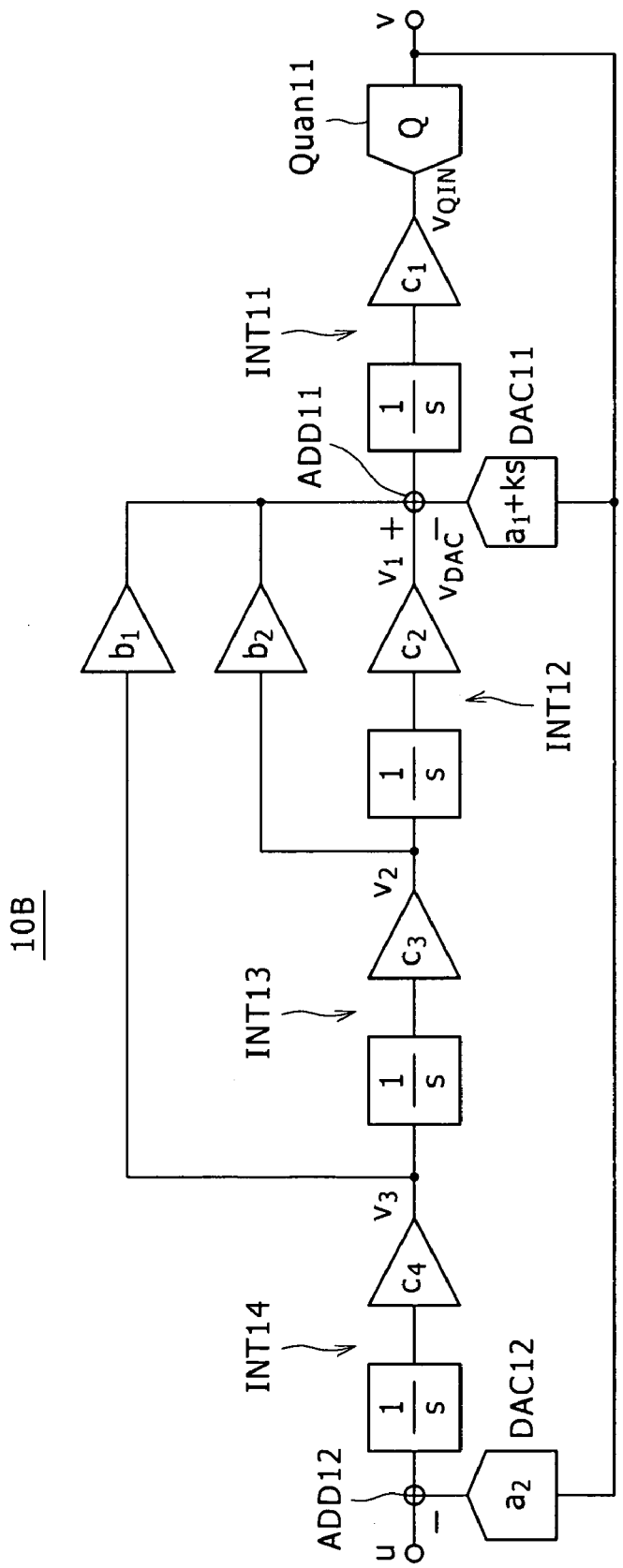
FIG. 13 is a block diagram showing a rough configuration of a ΔΣ modulator which has a loop delay compensation path according to a second embodiment of the present invention.

FIG. 13 is a block diagram showing a rough configuration of a ΔΣ modulator 10B which has a loop delay compensation path according to a second embodiment of the present invention.

The ΔΣ modulator 10B according to the second embodiment is different from the ΔΣ modulator 10A according to the first embodiment in that the ΔΣ modulator 10B newly employs a third integrator INT13 and a fourth integrator INT14 which are provided between the output side of the second adder ADD12 and the input side of the second integrator INT12.

In addition, in the case of the ΔΣ modulator 10B according to the second embodiment, a signal output by the fourth integrator INT14 is multiplied by a coefficient b1 in a multiplier section provided on a feed-forward path before being supplied to the first adder ADD11 as a feed-forward signal.

On top of that, in the case of the ΔΣ modulator 10B according to the second embodiment, a signal output by the third integrator INT13 is multiplied by a coefficient b2 in a multiplier section provided on another feed-forward path before being supplied to the first adder ADD11 as another feed-forward signal.

Second Concrete Configuration of the ΔΣ Modulator

Figure 14:
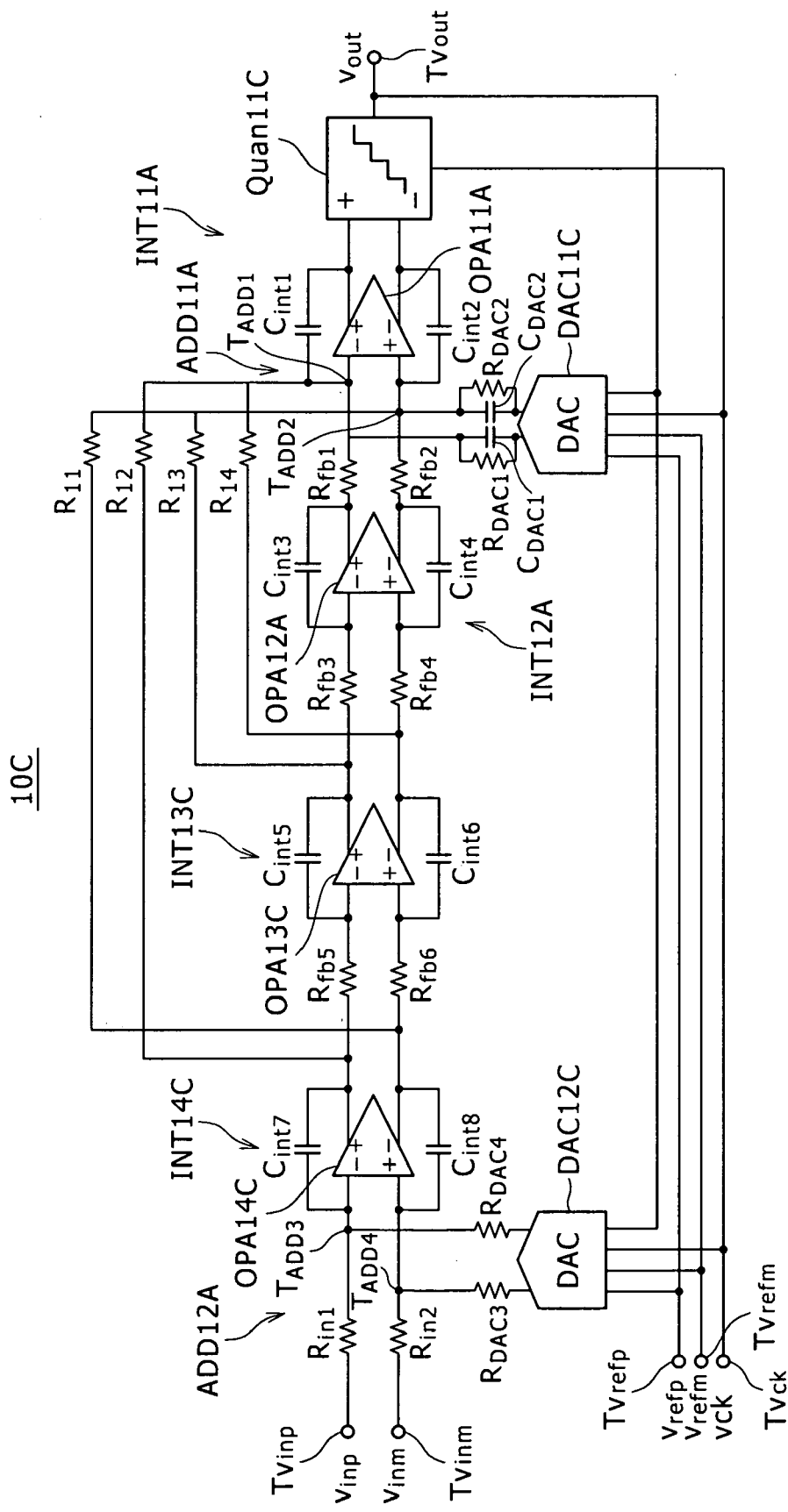
FIG. 14 is a circuit diagram showing a typical concrete configuration of a ΔΣ modulator which has a loop delay compensation path according to the second embodiment of the present invention.

FIG. 14 is a circuit diagram showing a typical concrete configuration of a ΔΣ modulator 100 which has a loop delay compensation path according to the second embodiment of the present invention.

The ΔΣ modulator 10C shown in the circuit diagram of FIG. 14 is designed to operate as a fourth-order 2-bit feedback/feed-forward ΔΣ modulator of the continuous time system.

Basically, the ΔΣ modulator 10C is obtained by adding a third integrator INT13C and a fourth integrator INT14C to the ΔΣ modulator 10A shown in the circuit diagram of FIG. 12.

In addition, the ΔΣ modulator 10C also has resistors $R_{fb3}$ and $R_{fb4}$ provided between the output side of the third integrator INT13C and the input side of the second integrator INT12A as well as resistors $R_{fb5}$ and $R_{fb6}$ provided between the output side of the fourth integrator INT14C and the input side of the third integrator INT13C.

On top of that, the ΔΣ modulator 100 also has resistors $R_{11}$ and $R_{12}$ provided on the feed-forward path mentioned above as well as resistors $R_{13}$ and $R_{14}$ provided on the other feed-forward path cited above.

The third integrator INT13C has an operational amplifier OPA13C, a capacitor $C_{int5}$ and a capacitor $C_{int6}$. The operational amplifier OPA13C has two input nodes for receiving a differential input signal and two output nodes for outputting a differential output signal.

The negative-side input node (−) of the operational amplifier OPA13C is connected to a specific one of the two ends of the resistor $R_{fb5}$ whereas the positive-side input node (+) of the operational amplifier OPA13C is connected to a specific one of the two ends of the resistor $R_{fb6}$. The negative-side input node (−) is also referred to as an inverting input node (−) whereas the positive-side input node (+) is also referred to as the non-inverting input node (+).

The positive-side output node (+) of the operational amplifier OPA13C is connected to a specific one of the two ends of the resistor $R_{fb3}$ whereas the negative-side output node (−) of the operational amplifier OPA13C is connected to a specific one of the two ends of the resistor $R_{fb4}$.

A point connecting the positive-side output node (+) of the operational amplifier OPA13C to the specific one of the two ends of the resistor $R_{fb3}$ is connected to the second node $T_{ADD2}$ of the first adder ADD11A by the resistor $R_{13}$.

On the other hand, a point connecting the negative-side output node (−) of the operational amplifier OPA13C to the specific one of the two ends of the resistor $R_{fb4}$ is connected to the first node $T_{ADD1}$ of the first adder ADD11A by the resistor $R_{14}$.

The capacitor $C_{int5}$ is connected between the positive-side output node (+) of the operational amplifier OPA13C and the negative-side input node (−) of the operational amplifier OPA13C.

On the other hand, the capacitor $C_{int6}$ is connected between the negative-side output node (−) of the operational amplifier OPA13C and the positive-side input node (+) of the operational amplifier OPA13C.

The other one of the two ends of the resistor $R_{fb3}$ is connected to the negative-side input node (−) of the operational amplifier OPA12A employed in the second integrator INT12A whereas the other one of the two ends of the resistor $R_{fb4}$ is connected to the positive-side input node (+) of the operational amplifier OPA12A employed in the second integrator INT12A.

By the same token, the fourth integrator INT14C has an operational amplifier OPA14C, a capacitor $C_{int7}$ and a capacitor $C_{int8}$. The operational amplifier OPA14C has two input nodes for receiving a differential input signal and two output nodes for outputting a differential output signal.

The negative-side input node (−) of the operational amplifier OPA14C is connected to the first node $T_{ADD3}$ of the second adder ADD12A whereas the positive-side input node (+) of the operational amplifier OPA14C is connected to the second node $T_{ADD4}$ of the second adder ADD12A.

The positive-side output node (+) of the operational amplifier OPA14C is connected to the other one of the two ends of the resistor $R_{fb5}$ whereas the negative-side output node (−) of the operational amplifier OPA14C is connected to the other one of the two ends of the resistor $R_{fb6}$.

A point connecting the positive-side output node (+) of the operational amplifier OPA14C to the other one of the two ends of the resistor $R_{fb5}$ is connected to the first node $T_{ADD1}$ of the first adder ADD11A by the resistor $R_{12}$.

On the other hand, a point connecting the negative-side output node (−) of the operational amplifier OPA14C to the other one of the two ends of the resistor $R_{fb6}$ is connected to the second node $T_{ADD2}$ of the first adder ADD11A by the resistor $R_{11}$.

The capacitor $C_{int7}$ is connected between the positive-side output node (+) of the operational amplifier OPA14C and the negative-side input node (−) of the operational amplifier OPA14C.

On the other hand, the capacitor $C_{int8}$ is connected between the negative-side output node (−) of the operational amplifier OPA14C and the positive-side input node (+) of the operational amplifier OPA14C.

In the ΔΣ modulator 10C according to the second embodiment, each of the quantizer Quan11C, the first DA converter DAC11C and the second DA converter DAC12C has a 2-bit configuration.

Each of the first DA converter DAC11C and the second DA converter DAC12C can be implemented by making use of two switch series circuits connected in parallel to each other as shown in the circuit diagram of FIG. 12.

Thus, by increasing the number of switch series circuits connected in parallel to each other, each of the ΔΣ modulator 10A serving as a typical implementation of the ΔΣ modulator 10 and the ΔΣ modulator 10C serving as a typical implementation of the ΔΣ modulator 10B can be used with ease as a multi-bit ΔΣ modulator.

The ΔΣ modulator is designed to into a configuration including a feedback path and/or a feed-forward path in order to assure stability. As is obvious from the embodiments described so far, however, the present invention can be applied to the ΔΣ modulator without regard to the configuration of the circuit of the ΔΣ modulator.

3. Third Embodiment

Third Rough Configuration of the ΔΣ Modulator

Figure 15:
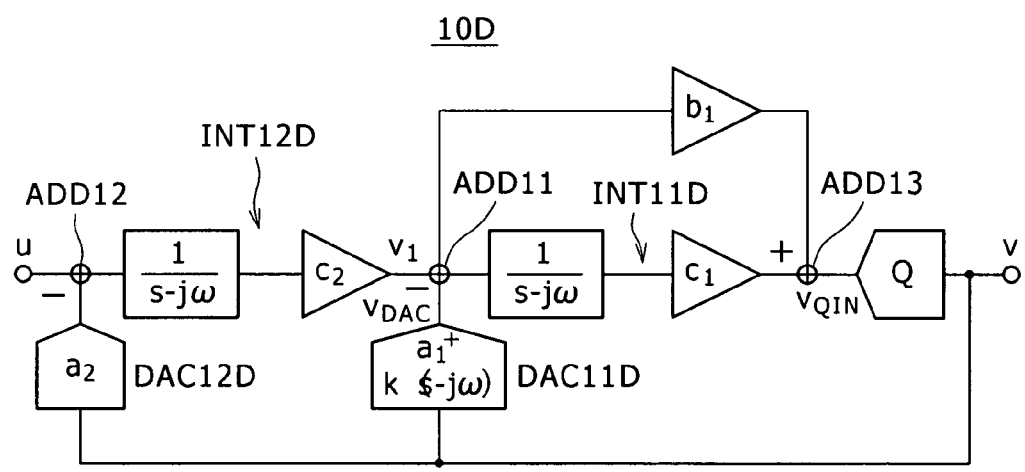
FIG. 15 is a block diagram showing a rough configuration of a ΔΣ modulator which has a loop delay compensation path according to a third embodiment of the present invention.

FIG. 15 is a block diagram showing a rough configuration of a ΔΣ modulator 10D which has a loop delay compensation path according to a third embodiment of the present invention.

The ΔΣ modulator 10D shown in the block diagram of FIG. 15 to serve as a ΔΣ modulator according to the third embodiment is designed to operate as a second-order 1-bit feedback complex ΔΣ modulator.

By setting the feedback gain of the first DA converter DAC11D employed in the ΔΣ modulator 10D at $[a_1+k(s-j\omega)]$, it is possible to realize a feedback path which has a frequency-independent part for delay compensation.

In addition, a third adder ADD13 is provided on the output side of the first integrator INT11D and a signal output by the second integrator INT12D is multiplied by a coefficient b1 in a multiplier section provided on a feed-forward path before being supplied to the third adder ADD13 as a feed-forward signal.

Third Concrete Configuration of the ΔΣ Modulator

Figure 16:
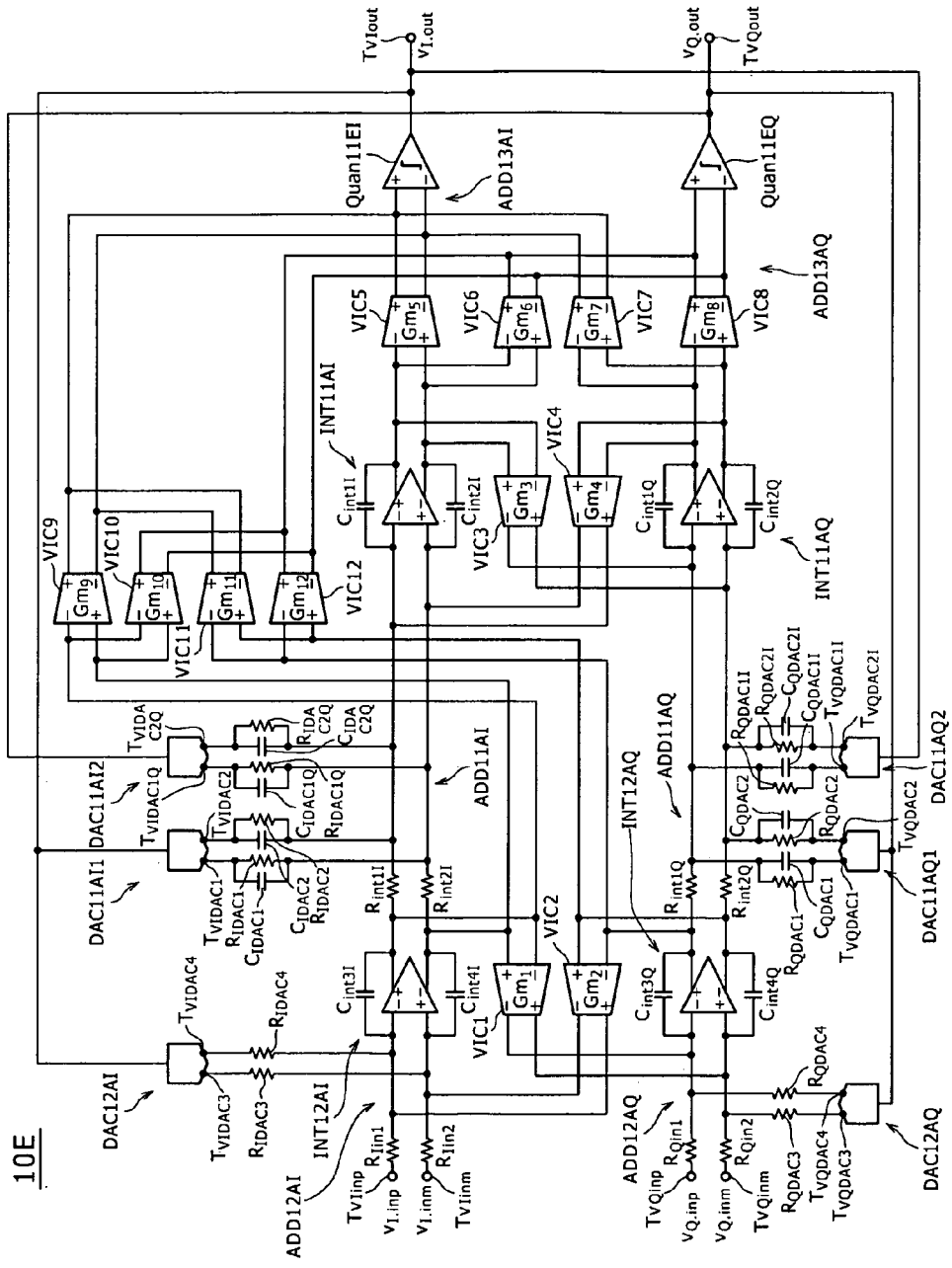
FIG. 16 is a circuit diagram showing a typical concrete configuration of a ΔΣ modulator which has a loop delay compensation path according to the third embodiment of the present invention.

FIG. 16 is a circuit diagram showing a typical concrete configuration of a ΔΣ modulator 10E which has a loop delay compensation path according to the third embodiment of the present invention.

The ΔΣ modulator 10E shown in the circuit diagram of FIG. 16 to serve as a ΔΣ modulator according to the third embodiment is designed to operate as a second-order 1-bit feedback/feed-forward complex ΔΣ modulator. The complex ΔΣ modulator 10E is implemented by making use of two low-pass ΔΣ modulators and by providing the cross-coupled paths between the two ΔΣ modulators for transitions of a pass band.

It is to be noted that the third embodiment is different from the first and second embodiments in that, in the case of the third embodiment, current driven quantizers Quan11EI and Quan11EQ are employed because a current addition process is carried out at a stage immediately preceding each of the quantizer Quan11EI and the quantizer Quan11EQ.

The ΔΣ modulator 10E shown in the circuit diagram of FIG. 16 to serve as a ΔΣ modulator according to the third embodiment is designed into a configuration which is capable of handling an in-phase signal also referred to as an I signal and a quadrature-phase signal also referred to as a Q signal.

In addition, the ΔΣ modulator 10E shown in the circuit diagram of FIG. 16 is configured to receive differential input signals. In the configuration shown in the circuit diagram of FIG. 16, components identical to their respective counterparts employed in the ΔΣ modulator 10A shown in the circuit diagram of FIG. 12 are denoted by the same reference numerals and/or the same reference notations as the counterparts in order to make the following description easy to understand.

In the circuit diagram of FIG. 16, reference notation $V_{I,inp}$ denotes a positive-side analog input I signal, reference notation $V_{Q,inp}$ denotes a positive-side analog input Q signal, reference notation $V_{I,inm}$ denotes a negative-side analog input I signal, reference notation $V_{Q,inm}$ denotes a negative-side analog input Q signal, reference notation $V_{I,out}$ denotes a digital output I signal and reference notation $V_{Q,out}$ denotes a digital output Q signal.

As shown in the circuit diagram of FIG. 16, on the I-signal processing side, the ΔΣ modulator 10E has a first analog-signal input terminal $T_{VIinp}$ for receiving the positive-side analog input I signal $V_{I,inp}$, a second analog-signal input terminal $T_{VIinm}$ for receiving the negative-side analog input I signal $V_{I,inm}$ and a digital I signal output terminal $T_{VIout}$ for outputting the digital output I signal $V_{I,out}$.

In addition, also on the I-signal processing side, the ΔΣ modulator 10E also has input resistors $R_{Iin1}$ and $R_{Iin2}$.

On top of that, also on the I-signal processing side, the ΔΣ modulator 10E also has a quantizer Quan11EI, a first integrator INT11AI and an second integrator INT12AI.

Furthermore, also on the I-signal processing side, the ΔΣ modulator 10E also has a first DA converter DAC11AI1 for converting a digital I signal into an analog signal and a first DA converter DAC11AI2 for converting a digital Q signal into an analog signal.

Moreover, also on the I-signal processing side, the ΔΣ modulator 10E also has a second DA converter DAC12AI, a first adder ADD11AI and a second adder ADD12AI.

In addition, the ΔΣ modulator 10E also has a resistor $R_{IDAC1}$ and a capacitor $C_{IDAC1}$ which together form a parallel circuit connected to a first output node $T_{VIDAC1}$ of the first DA converter DAC11AI1 for converting a digital I signal into an analog signal.

On top of that, the ΔΣ modulator 10E also has a resistor $R_{IDAC2}$ and a capacitor $C_{IDAC2}$ which together form a parallel circuit connected to a second output node $T_{VIDAC2}$ of the first DA converter DAC11AI1.

Furthermore, the ΔΣ modulator 10E also has a resistor $R_{IDAC1Q}$ and a capacitor $C_{IDAC1Q}$ which together form a parallel circuit connected to a first output node $T_{VIDAC1Q}$ of the first DA converter DAC11AI2 for converting a digital Q signal into an analog signal.

Moreover, the ΔΣ modulator 10E also has a resistor $R_{IDAC2Q}$ and a capacitor $C_{IDAC2Q}$ which together form a parallel circuit connected to a second output node $T_{VIDAC2Q}$ of the first DA converter DAC11AI2.

On top of that, the ΔΣ modulator 10E also has a resistor $R_{IDAC3}$ connected to a first output node $T_{VIDAC3}$ of the second DA converter DAC12AI and a resistor $R_{IDAC4}$ connected to a second output node $T_{VIDAC4}$ of the second DA converter DAC12AI.

As shown in the circuit diagram of FIG. 16, on the Q-signal processing side, the ΔΣ modulator 10E has a third analog-signal input terminal $T_{V_{Qinp}}$ for receiving the positive-side analog input Q signal $V_{Q,inp}$, a fourth analog-signal input terminal $T_{V_{Qinm}}$ for receiving the negative-side analog input Q signal $V_{Q,inm}$ and a digital Q signal output terminal $T_{V_{Qout}}$ for outputting the digital output Q signal $V_{Q,out}$.

In addition, also on the Q-signal processing side, the ΔΣ modulator 10E also has input resistors $R_{Qin1}$ and $R_{Qin2}$.

On top of that, also on the Q-signal processing side, the ΔΣ modulator 10E also has a quantizer Quan11EQ, a first integrator INT11AQ and an second integrator INT12AQ.

Furthermore, also on the Q-signal processing side, the ΔΣ modulator 10E also has a first DA converter, DAC11AQ1 for converting a digital Q signal into an analog signal and a first DA converter DAC11AQ2 for converting a digital I signal into an analog signal.

Moreover, also on the Q-signal processing side, the ΔΣ modulator 10E also has a second DA converter DAC12AQ, a first adder ADD11AQ and a second adder ADD12AQ.

In addition, the ΔΣ modulator 10E also has a resistor $R_{QDAC1}$ and a capacitor $C_{QDAC1}$ which together form a parallel circuit connected to a first output node $T_{V_{QDAC1}}$ of the first DA converter DAC11AQ1 for converting a digital Q signal into an analog signal.

On top of that, the ΔΣ modulator 10E also has a resistor $R_{QDAC2}$ and a capacitor $C_{QDAC2}$ which together form a parallel circuit connected to a second output node $T_{V_{QDAC2}}$ of the first DA converter DAC11AQ1.

Furthermore, the ΔΣ modulator 10E also has a resistor $R_{QDAC1I}$ and a capacitor $C_{QDAC1I}$ which together form a parallel circuit connected to a first output node $T_{V_{QDAC1I}}$ of the first DA converter DAC11AQ2 for converting a digital I signal into an analog signal.

Moreover, the ΔΣ modulator 10E also has a resistor $R_{QDAC2I}$ and a capacitor $C_{QDAC2I}$ which together form a parallel circuit connected to a second output node $T_{V_{QDAC2I}}$ of the first DA converter DAC11AQ2.

On top of that, the ΔΣ modulator 10E also has a resistor $R_{QDAC3}$ connected to a first output node $T_{V_{QDAC3}}$ of the second DA converter DAC12AQ and a resistor $R_{QDAC4}$ connected to a second output node $T_{V_{QDAC4}}$ of the second DA converter DAC12AQ.

It is to be noted that the basic configuration of every section employed in the ΔΣ modulator 10E shown in the circuit diagram of FIG. 16 is identical with that of every section employed in the ΔΣ modulator 10A shown in the circuit diagram of FIG. 12. Therefore, it is not necessary to explain details of the basic configuration of every section employed in the ΔΣ modulator 10E shown in the circuit diagram of FIG. 16.

In addition, the DE modulator 10E is also provided with VI (voltage-to-current) converters VIC1 to VIC12 which are each used for converting a voltage into a current.

The voltage-to-current converter VIC1 is a converter for converting a voltage output by the second integrator INT12AI provided on the I-signal processing side into a current and supplying the current to the second adder ADD12AQ provided on the Q-signal processing side.

The voltage-to-current converter VIC2 is a converter for converting a voltage output by the second integrator INT12AQ provided on the Q-signal processing side into a current and supplying the current to the second adder ADD12AI provided on the I-signal processing side.

The voltage-to-current converter VIC3 is a converter for converting a voltage output by the first integrator INT11AI provided on the I-signal processing side into a current and supplying the current to the first adder ADD11AQ provided on the Q-signal processing side.

The voltage-to-current converter VIC4 is a converter for converting a voltage output by the first integrator INT11AQ provided on the Q-signal processing side into a current and supplying the current to the first adder ADD11AI provided on the I-signal processing side.

The voltage-to-current converter VIC5 is a converter for converting a voltage output by the first integrator INT11AI provided on the I-signal processing side into a current and supplying the current to the third adder ADD13AI provided on the I-signal processing side.

The voltage-to-current converter VIC6 is a converter for converting a voltage output by the first integrator INT11AI provided on the I-signal processing side into a current and supplying the current to the third adder ADD13AQ provided on the Q-signal processing side.

The voltage-to-current converter VIC7 is a converter for converting a voltage output by the first integrator INT11AQ provided on the Q-signal processing side into a current and supplying the current to the third adder ADD13AI provided on the I-signal processing side.

The voltage-to-current converter VIC8 is a converter for converting a voltage output by the first integrator INT11AQ provided on the Q-signal processing side into a current and supplying the current to the third adder ADD13AQ provided on the Q-signal processing side.

The voltage-to-current converter VIC9 is a converter for converting a voltage output by the second integrator INT12AI provided on the I-signal processing side into a current and supplying the current to the third adder ADD13AI provided on the I-signal processing side.

The voltage-to-current converter VIC10 is a converter for converting a voltage output by the second integrator INT12AI provided on the I-signal processing side into a current and supplying the current to the third adder ADD13AQ provided on the Q-signal processing side.

The voltage-to-current converter VIC11 is a converter for converting a voltage output by the second integrator INT12AQ provided on the Q-signal processing side into a current and supplying the current to the third adder ADD13AI provided on the I-signal processing side.

The voltage-to-current converter VIC12 is a converter for converting a voltage output by the second integrator INT12AQ provided on the Q-signal processing side into a current and supplying the current to the third adder ADD13AQ provided on the Q-signal processing side.

Figure 17A:
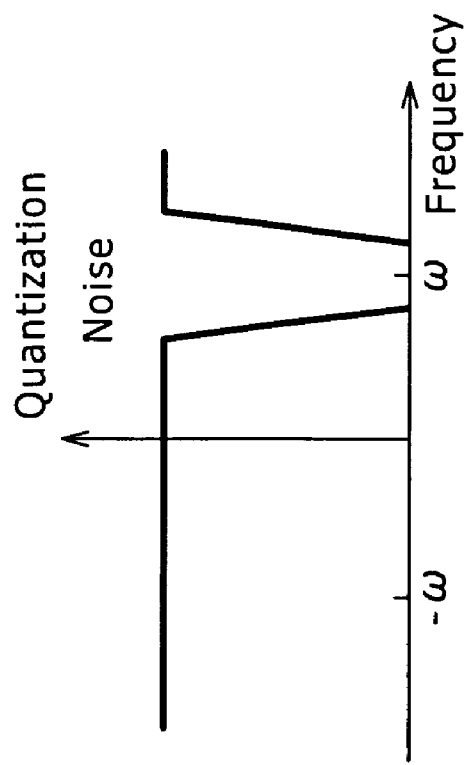
FIGS. 17A and 17B are a plurality of diagrams each showing a noise shaping characteristic of a ΔΣ modulator.

As shown in a diagram of FIG. 17A, a low-pass ΔΣ modulator has a noise shaping characteristic which is symmetrical with respect to an axis serving as the boundary between the negative-frequency region and the positive-frequency region. On the other hand, a complex ΔΣ modulator such as the ΔΣ modulator 10E having the configuration described above can be provided with a noise shaping characteristic which is asymmetrical with respect to the axis serving as the boundary between the negative-frequency region and the positive-frequency region as shown in a diagram of FIG. 17B.

Figure 17B:
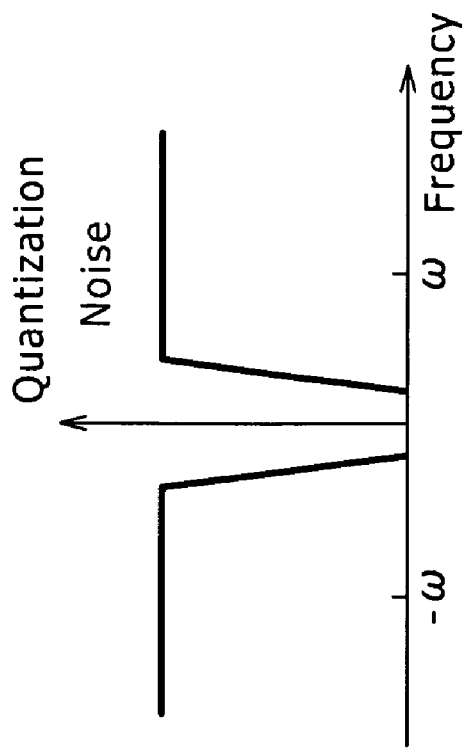

FIGS. 17A and 17B are a plurality of diagrams each showing a broken line approximating a noise shaping characteristic of a ΔΣ modulator.

When desired information exists in the vicinity of a frequency ω, it is necessary to attenuate quantization noises in the vicinity of the frequency ω as shown in the diagram of FIG. 17B.

That is to say, since desired information doesn't exist in the vicinity of a frequency −ω, large quantization noises in the vicinity of the frequency −ω do not raise a problem.

The circuit of the ΔΣ modulator 10E handles the input signal as I and Q signals and the circuit has a function to suppress an image signal which becomes a problem in the IQ-signal processing. Thus, the present invention is widely applied in the field of radio communication.

Since the present invention can be implemented without modifying the configuration of each DA converter, the present invention can be applied with ease even to such a special ΔΣ modulator.

As described above, in accordance with the embodiments described above, a continuous-time-system ΔΣ AD converter, which is applied to audio-electronic and medical-treatment/measurement apparatus and the like in addition to radio-communication receivers serving as main applications, has the following advantages:

A signal path including no integration terms is added to the AD converter serving as a ΔΣ modulator according to the present invention by making use of a DA converter which adopts the NRZ technique. The signal path compensates the input/output voltage transfer characteristic of the ΔΣ modulator for a characteristic change caused by a loop delay attributed a propagation delay generated in each circuit block of the ΔΣ modulator. As a result, the ΔΣ modulator is capable of compensating the input/output voltage transfer characteristic for such a characteristic change while preventing the amplitude of a signal appearing at the input node of a quantizer employed in the ΔΣ modulator from increasing.

In addition, the DE modulator according to the present invention also allows an internal DA converter required by the ΔΣ modulator in related art to be eliminated from the ΔΣ modulator according to the present invention. Thus, it is possible to reduce the power consumption of the entire circuit of the ΔΣ modulator according to the present invention.

In addition, it should be understood by those skilled in the art that a variety of modifications, combinations, sub-combinations and alterations may occur, depending on design requirements and other factors as far as they are within the scope of the appended claims or the equivalents thereof.

The present application contains subject matter related to that disclosed in Japanese Priority Patent Application JP 2009-113746 filed in the Japan Patent Office on May 8, 2009, the entire content of which is hereby incorporated by reference:

What is claimed is:

1. A ΔΣ modulator comprising:
   at least one integrator;
   a quantizer for quantizing a signal output by said integrator and outputting said quantized signal as a digital signal; and
   a compensation section configured to compensate said ΔΣ modulator for a non-ideal characteristic caused by an internal loop delay, wherein
   said compensation section is a feedback path formed to start at the output node of said quantizer and end at the input node of said integrator immediately preceding said quantizer, and
   said feedback path formed to start at said output node of said quantizer and end at said input node of said integrator does not exhibit a frequency-dependent characteristic.

* * * * *